United States Patent
Gaucher et al.

(10) Patent No.: US 7,342,299 B2
(45) Date of Patent: Mar. 11, 2008

(54) APPARATUS AND METHODS FOR PACKAGING ANTENNAS WITH INTEGRATED CIRCUIT CHIPS FOR MILLIMETER WAVE APPLICATIONS

(75) Inventors: Brian P. Gaucher, Brookfield, CT (US); Duixian Liu, Scarsdale, NY (US); Ullrich R. Pfeiffer, Yorktown Heights, NY (US); Thomas M. Zwick, Kisslegg (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/231,919

(22) Filed: Sep. 21, 2005

(65) Prior Publication Data

US 2007/0063056 A1 Mar. 22, 2007

(51) Int. Cl.
*H01L 23/02* (2006.01)

(52) U.S. Cl. .......................... 257/674; 257/676

(58) Field of Classification Search ................ 257/700, 257/673, 674, 666, 685, 692, 778, 786, E23.015, 257/81; 235/492, 486
See application file for complete search history.

(56) References Cited

U.S. PATENT DOCUMENTS 6,373,447 B1* 4/2002 Rostoker et al. ............ 343/895

* cited by examiner

*Primary Examiner*—Leonardo Andujar
(74) *Attorney, Agent, or Firm*—F. Chau & Associates, LLC

(57) ABSTRACT

Apparatus and methods are provided for integrally packaging antennas with semiconductor IC (integrated circuit) chips to provide highly-integrated and high-performance radio/wireless communications systems for millimeter wave applications including, e.g., voice communication, data communication and radar applications. For example, wireless communication modules are constructed with IC chips having receiver/transmitter/transceiver integrated circuits and planar antennas that are integrally constructed from BEOL (back end of line) metallization structures of the IC chip.

19 Claims, 6 Drawing Sheets

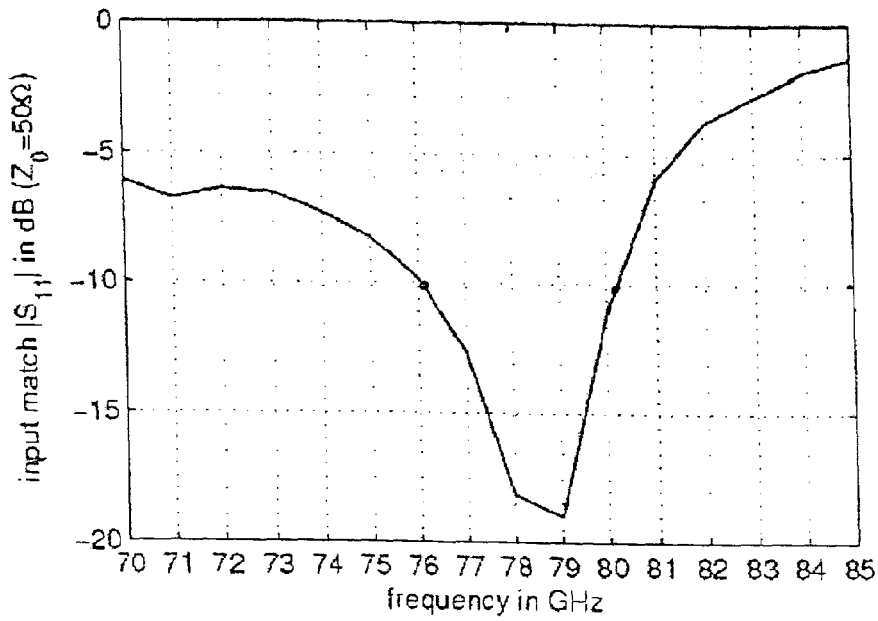
FIG. 10
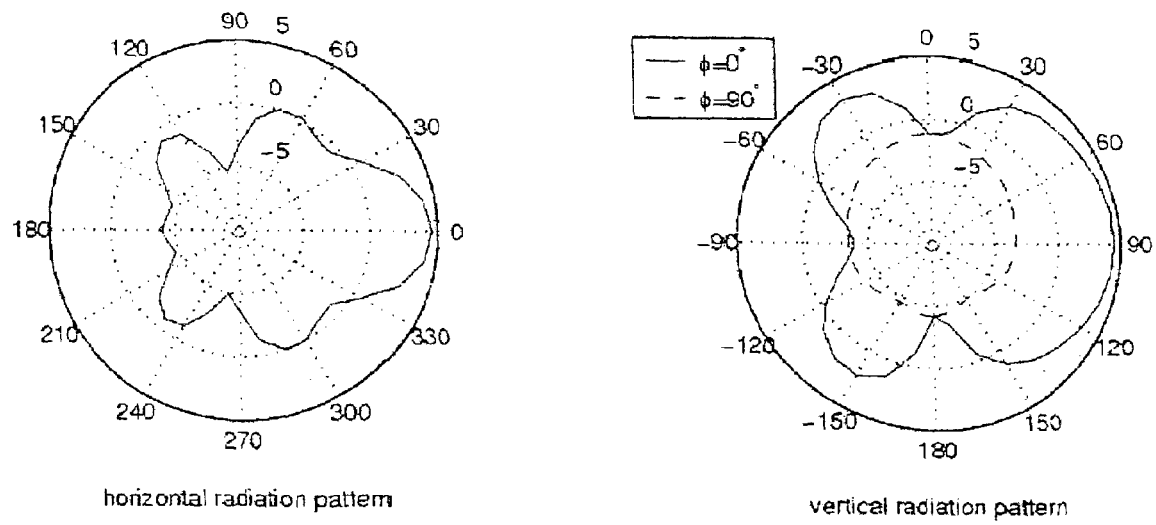
horizontal radiation pattern
vertical radiation pattern
FIG. 11
FIG. 12

APPARATUS AND METHODS FOR PACKAGING ANTENNAS WITH INTEGRATED CIRCUIT CHIPS FOR MILLIMETER WAVE APPLICATIONS

TECHNICAL FIELD OF THE INVENTION

The present invention generally relates to apparatus and methods for integrally packaging antenna devices with semiconductor IC (integrated circuit) chips and, in particular, apparatus and methods for packaging IC chips with planar antennas that are integrally constructed from BEOL (back end of line) metallization structures, for example, to thereby form compact integrated radio/wireless communications systems for millimeter wave applications.

BACKGROUND

Technological innovations in wireless systems and devices have lead to widespread development of wireless network applications for wireless PAN (personal area network), wireless LAN (local area network), wireless WAN (wide area network), cellular networks, and other types of wireless communication systems. To enable wireless communication between devices in a wireless network, the devices must be equipped with receivers, transmitters, or transceivers, as well as antennas that can efficiently radiate/receive signals transmitted to/from other devices in the network.

Conventional MMW (millimeter-wave) radio communication systems are typically constructed using discrete components that are individually encapsulated and/or mounted with low integration levels on printed circuit boards, packages or substrates. For example, MMW radio communication systems are typically built using expensive and bulky wave guides and/or package-level or board-level microstrip structures that provide electrical connections between semiconductor chips (RF integrated circuits) and between semiconductor chips and transmitter or receiver antennas.

There is an increasing market demand, however, for more compact radio communication systems with integrated transmitter/receiver/transceiver and antenna systems, which provide high-performance, high data transmission rate, high-volume, low-power consumption, low cost, and low weight solutions. Indeed, current communication systems require high performance antenna systems that provide wide bandwidth and high-efficiency operating characteristics. As the operating frequency increases, the manufacture and assembly of conventional waveguide front-ends become more difficult. In this regard, innovations in semiconductor fabrication and packaging technologies, coupled with requirements for higher operating frequencies, have made it practically feasible for integrating antennas with RF integrated circuits to provide highly integrated radio communication systems.

With increased integration, however, the ability to achieve high performance systems becomes more problematic, especially at millimeter wave frequencies wherein the structure and EM characteristics of the integrated antenna system will determine the achievable performance of the system. With high-integration designs, design tradeoffs are typically made with respect to antenna performance (e.g., tradeoffs between antenna bandwidth and efficiency).

SUMMARY OF THE INVENTION

In general, exemplary embodiments of the invention include apparatus and methods for integrally packaging antennas with semiconductor IC (integrated circuit) chips to provide highly-integrated and high-performance radio/wireless communications systems for millimeter wave applications including, e.g., voice communication, data communication and radar applications. More specifically, exemplary embodiments of the invention include apparatus and methods for constructing compact wireless communication modules with IC chips having integrated receiver, transmitter, or transceiver circuits and/or other on-chip RF component or circuits, as well as planar antennas that are integrally constructed from BEOL (back end of line) metallization structures of the IC chip.

In one exemplary embodiment, an electronic apparatus includes a metallic package frame and IC (integrated circuit) chip and a non-metallic package cover. The IC chip comprises an active circuit region and an antenna region, wherein the antenna region comprises an antenna integrally formed as part of a BEOL (back-end-of-line) metallization structure of the IC chip.

In one embodiment, the metallic package frame comprises a mesa structure having a chip mounting surface, wherein the IC chip is mounted to the chip mounting surface such that the antenna region of the IC chip extends past an edge of the chip mounting surface. Further, the antenna region of the IC chip is disposed over a cavity region of the metallic package frame, wherein the cavity region comprises metallic bottom and sidewall surfaces. The cavity may be filled with air, or a dielectric material. The cavity region may include a parabolic reflector.

In another exemplary embodiment of the invention, the IC chip may include an integrated reflector element formed between the active circuit region and antenna region to reduce radiation coupling to the active circuit region.

In yet another exemplary embodiment of the invention, a semiconductor IC (integrated circuit) chip includes a semiconductor substrate comprising an active device region and an antenna region. The antenna region comprises a Yagi antenna that is integrally formed as part of the BEOL (back-end-of-line) metallization. The Yagi antenna comprises a reflector element, fed dipole element and director element, wherein the reflector element is disposed between the fed dipole element and the active device region, and wherein the Yagi antenna is directional in a horizontal plane of the semiconductor substrate in a direction away from the active device region towards an edge of the antenna region.

In another exemplary embodiment of the invention, the antenna region may comprises a plurality of Yagi antennas forming a linear antenna array. The active device region may include beam-forming circuitry, which is connected to each Yagi antenna in the linear array via an integrated antenna feed network, to control a radiation pattern generated by the linear Yagi antenna array.

In another exemplary embodiment of the invention, an IC chip having integrated linear Yagi antenna array can be mounted into a low cost aluminum package with an integrated cylindrical parabolic reflector to construct a low cost automotive radar module. Digital beam forming techniques can be employed to achieve a desired horizontal angular resolution, while a narrow vertical beam width (as required in certain radar applications) can be achieved by the parabolic reflector.

These and other exemplary embodiments, aspects, features and advantages of the present invention will be described or become apparent from the following detailed description of exemplary embodiments, which is to be read in connection with the accompanying drawings.

BRIEF DESCRIPTION OF THE DRAWINGS

FIG. 10 is a graphical diagram illustrating the simulated return loss of a computer-modeled antenna system according to an exemplary embodiment of the invention.

FIGS. 11 and 12 are graphical diagrams illustrating the simulated horizontal and vertical radiation patterns, respectively, of the computer-modeled antenna system.

DETAILED DESCRIPTION OF EXEMPLARY EMBODIMENTS

Figure 1:
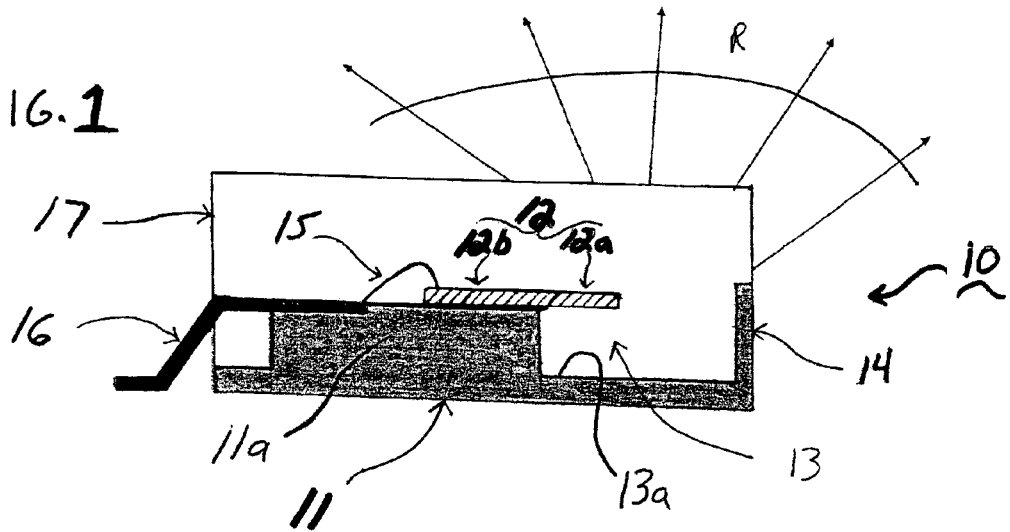
FIG. 1 is a schematic diagram illustrating an apparatus for integrally packaging an antenna and IC chip, according to an exemplary embodiment of the present invention.

In general, exemplary embodiments of the invention as described herein include apparatus and methods for integrally packaging antennas with semiconductor IC (integrated circuit) chips to provide highly-integrated and high-performance radio/wireless communications systems for millimeter wave applications including, e.g., voice communication, data communication and radar applications. More specifically, exemplary embodiments of the invention include apparatus and methods for constructing compact wireless communication modules in which antenna systems are integrally packaged with IC chips having integrated receiver/transmitter/transceiver circuits. For example, exemplary embodiments of the invention (such as described below with reference to FIGS. 1-2 and 7-9) include wireless communication modules that include IC chips having on-chip active RF circuits and planar antennas that are integrally formed as part of a BEOL (back-end-of-line) metallization structure of the IC chip. In other exemplary embodiments of the invention (such as described below with reference to FIGS. 3-6), wireless communication modules are constructed by packaging IC chips having on-chip active RF circuits together with planar antennas formed on separate semiconductor/dielectric substrates.

It is to be appreciated that wireless communication modules according to exemplary embodiments of the invention provide compact, high-performance, low-cost designs for millimeter wave applications. In accordance with exemplary embodiments of the invention, when integrally packaging planar antennas with IC chips having RF active circuits, various factors such as package structure/layout and package component materials are taken into consideration so as to obtain a desired integration level and system performance. For example, with planar antennas formed on semiconductor/dielectric substrates, antenna characteristics such as bandwidth and efficiency will depend on the substrate material, as well as surrounding structures/materials.

By way of example, the bandwidth-efficiency product of a planar antenna for a given operating frequency will depend on properties such as the dielectric constant and dielectric loss tangent of the substrate material. In general, the antenna efficiency (which is a measure of relation between the power radiated by an antenna and the power input to the antenna) will decrease due to higher dielectric resistive losses and impedance mismatches. Furthermore, the bandwidth-efficiency product is affected by the dielectric constant of the substrate material. In general, when planar antennas fabricated on dielectric substrates, EM power can be coupled into the substrate resulting in power loss. Indeed, with high dielectric constant substrates, electromagnetic waves tend to stay in the substrate material resulting in the formation of substrate and surface waves along the semiconductor die, which may cause a substantial amount of energy being fed back into the IC circuits with on-chip antenna designs. The use of a substrate material having a lower dielectric constant leads to a higher bandwidth-efficiency product.

Furthermore, when constructing compact wireless communication modules with integrated antennas, the antenna performance will vary depending on the antenna structure together with package structures and component materials that are disposed in proximity to the antenna. In this regard, the antenna should be designed in consideration of the package layout. Another factor for on-chip antennas is die cost. Since die area of semiconductor processes for fabricating MMW circuits (GaAs, InP, SiGe, very high performance CMOS) is very expensive, it is desirable to minimize the size of the area that is needed for the antenna (small antenna sizes are highly preferred). Moreover, for purposes of high reproducibility, robustness, and low production costs, it is desirable to provide compact wireless communication module designs that can be constructed using standard semiconductor fabrication and chip packaging techniques.

Wireless communication modules according to exemplary embodiments of the invention will now be described in further detail with reference to the illustrative embodiments depicted in the accompany Figures, which are designed in consideration of the above factors, while using standard semiconductor fabrication and packaging techniques to provide compact, high-performance, low-cost solutions for millimeter wave applications FIG. 1 is a schematic diagram illustrating an apparatus for integrally packaging an antenna and IC chip, according to an exemplary embodiment of the present invention. More specifically, FIG. 1 is a side-view schematic illustration of an apparatus (10) (or wireless communication module) for packaging an IC chip having one or more antennas integrally formed as part of the BEOL metallization, according to an exemplary embodiment of the invention. Referring to FIG. 1, the apparatus (10) comprises a metallic package base (11) which functions as a package frame structure. The package base (11) may be, for example, a leaded or non-leaded package frame that is fabricated using known methods. The package base (11) comprises a raised portion or mesa-type structure (11a). A semiconductor die (12) (or IC chip) is mounted on an upper surface of the mesa structure (11a). The IC chip (12) comprises an antenna region (12a) and active device region (12b). The antenna region (12a) comprises one or more planar antennas integrally formed on an active surface of the IC chip (12). The active device region (12b) comprises various types of integrated circuit devices and elements, such as receivers, transmitters, transceivers, etc.

The IC chip (12) is backside mounted (epoxy, solder, etc.) to the raised mesa structure (11a) such that the antenna region (12a) of the IC chip (12) extends past the surface edge of the mesa (11a) and is disposed over a cavity region (13). A bottom surface (13a) of the cavity (13) acts as a reflector to ensure that no energy is radiated into the board on which the module (10) is mounted. The reflector effectively limits the antenna radiation to the upper hemisphere above the antenna and enables consistent antenna operation. The cavity (13) is surrounded by metallic walls (14). The metallic bottom surface (13a) and walls (14) prevent radiation loss and ensure that the antenna radiation R is radiated in some direction in an upper hemisphere, as depicted in FIG. 1.

The apparatus (10) further comprises wire bonds (15) that provide electrical connections (for I/O signals and power) between bond pads on the active surface of the IC chip (12) and appropriate package leads (16) The package structure is encapsulated by an encapsulation layer (17). The encapsulation layer (17) may be formed using any suitable material having a low dielectric loss. The encapsulation material (17) should have low dielectric loss to achieve efficient antenna radiation, but provide sufficient protection for the IC chip (12) and bond wires (15). In another exemplary embodiment of the invention, the encapsulant or lid (17) can be designed with beam-forming structures, such as lenses or other suitable structures.

In other exemplary embodiments of the invention, reflector and or beamshaping patterns may be formed in the antenna region (12a) or between the antenna and device regions (12a) and (12b) for purposes of, e.g., reducing EM coupling from the antenna to the active devices and increasing radiation or wave propagation in a desired direction. These patterns are designed to limit the effect of surface/substrate waves that propagate in a direction along the plane of the antenna substrate. These patterns can be designed to provide more gain/radiation in a desired direction parallel and/or perpendicular to the antenna substrate and/or suppress radiation or wave propagation in the direction parallel to the substrate toward the active device region (12b).

Figure 2:
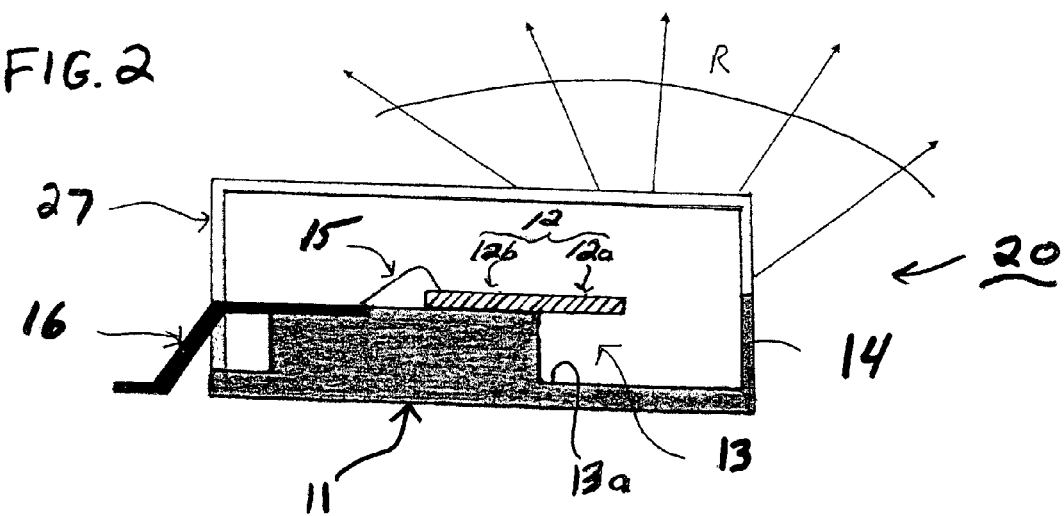
FIG. 2 is a schematic diagram illustrating an apparatus for integrally packaging an antenna and IC chip, according to another exemplary embodiment of the present invention.

FIG. 2 schematically depicts an electronic apparatus (20) for packaging an antenna and IC chip, according to an exemplary embodiment of the present invention. The electronic apparatus (20) of FIG. 2 has a structure that is similar to that of the electronic apparatus (10) of FIG. 1, except that the electronic apparatus (20) comprises a package lid (27) (or package cap). The package lid (27) is preferably formed of a low loss material such as polypropylene, polyimide, or other suitable materials. With such embodiment, the antenna region (12a) is surrounded by air or vacuum, as opposed to being embedded within encapsulation material as in the apparatus (10) of FIG. 1. In another exemplary embodiment, the lid (27) can be designed with beam-forming structures, such as lenses or other suitable structures.

It is to be appreciated that the exemplary wireless communication modules of FIGS. 1 and 2 can be designed to optimize system performance and constructed using standard chip fabrication and packaging methods to reduce manufacturing cost and increase yield. For instance, the IC chip (12) can be formed of a semiconductor material that has a relatively high dielectric constant and low dielectric loss at MMW frequencies (such as silicon, GaAs InP or other existing or future semiconductor materials such as GaN). The use of material with low dielectric loss provides increased antenna efficiency.

Moreover, the use of high dielectric constant substrate material reduces the dielectric wavelength (as compared to the free space wavelength) for the given operating frequency of the antenna, which enables a significant reduction in the antenna size for the given operating frequency. For on-chip antenna designs, a reduction in antenna size minimizes the required die area of the antenna region (12a) and thus, increases the available die area for active devices in the device region (12b). In this manner, the overall chip size can be minimized for chips having separate antenna and devices regions. Advantageously, overall system efficiency at millimeter wave applications can be achieved by fabricating on-chip antennas on high permittivity substrates such as GaAs and InP, thereby allowing high level integration of antenna elements and transmitter/receiver modules in a monolithic fashion. Accordingly, MMIC (microwave monolithic integrated circuits) devices can be constructed with on-chip antennas.

Furthermore, EM coupling to the active device region as a result of high dielectric constant substrate, various structures such as reflectors or beam shaping patterns can be formed between the antenna region (12a) and the active device region (12b) to minimize or prevent the EM coupling from the antenna region (12a) to the active device region (12b).

Figure 7:
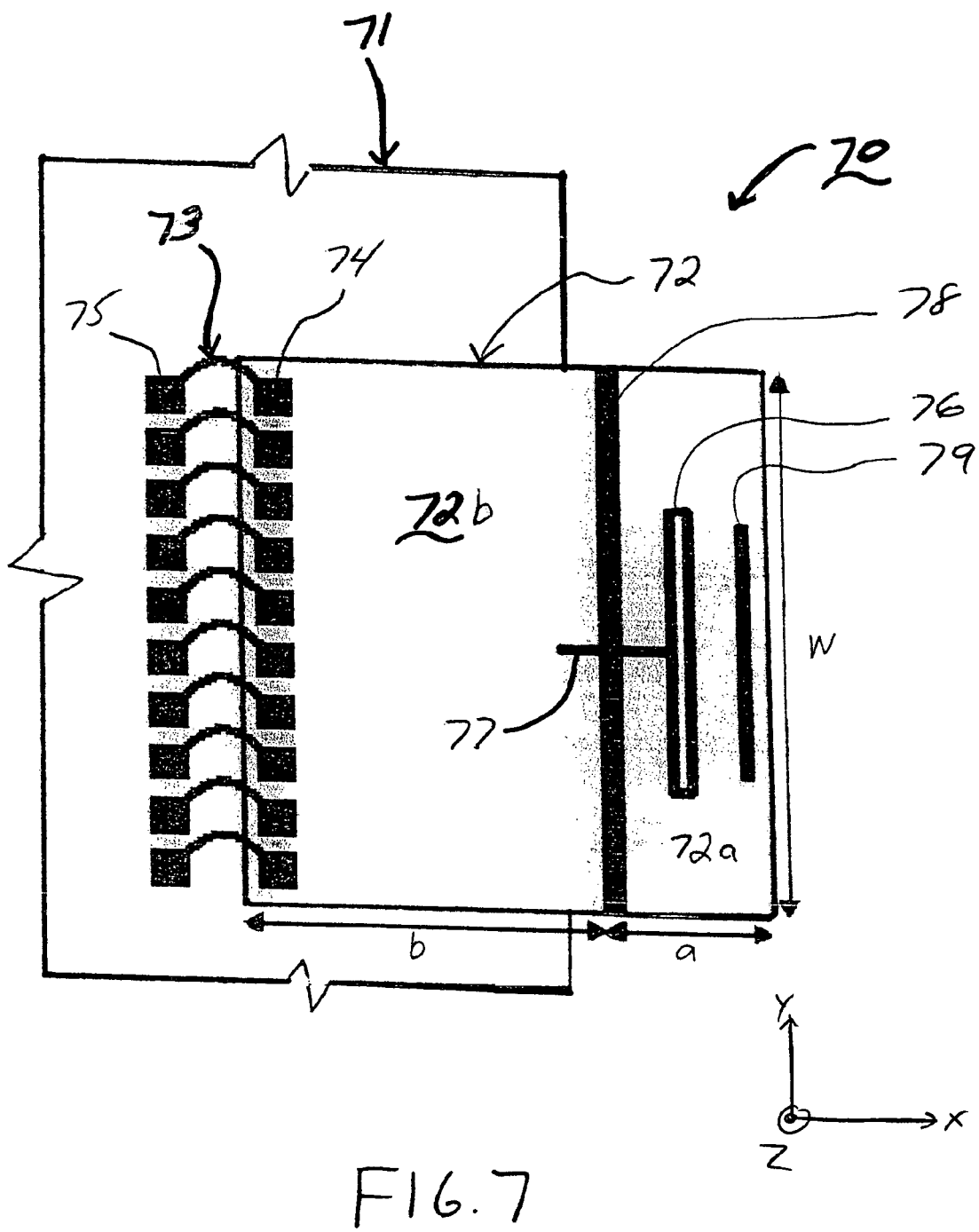
FIG. 7 is a schematic diagram illustrating an apparatus for integrally packaging an antenna and IC chip, according to another exemplary embodiment of the present invention.
Figure 8:
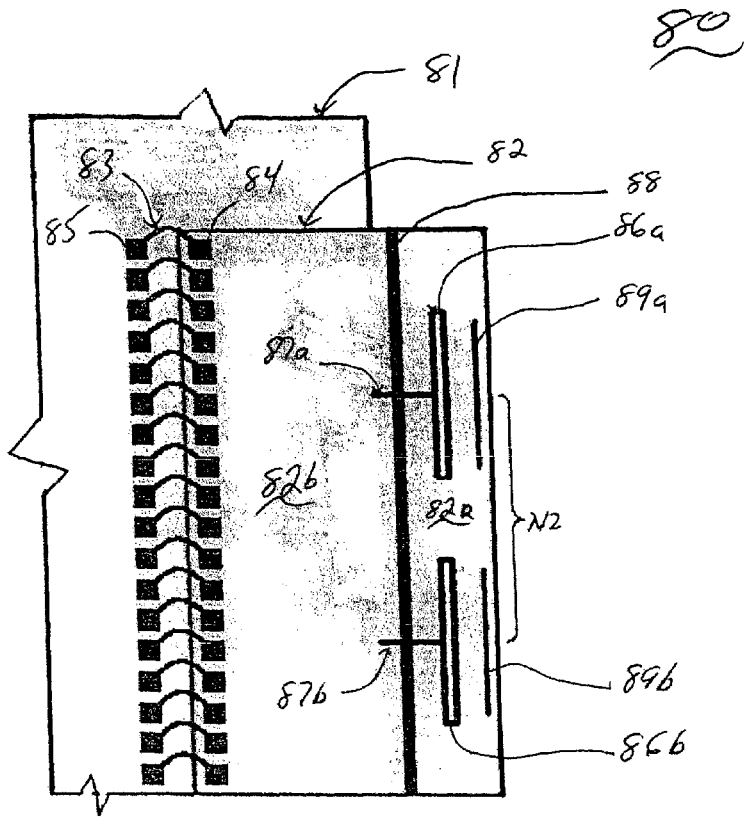
FIG. 8 is a schematic diagram illustrating an apparatus for integrally packaging an antenna and IC chip, according to another exemplary embodiment of the present invention.

By using standard BEOL processing techniques to construct the planar antenna(s) in the antenna region (12a) (as well as antenna feeds and other structure), small size antennas (and other structures) can be formed with the accuracy and reproducibility that is required to achieve lost cost and high yield mass production. Depending on the intended application and/or frequency of operation, the antenna region (12a) may comprise one or more of any suitable type of antenna that is patterned as part of the BEOL metallization layers, such as a dipole antennas, a folded dipole antennas, ring antennas, rectangular loop antennas, patch antennas, coplanar patch antennas, monopole antennas, etc., as well one or more of various types of antenna feed and/or impedance matching networks, such as balanced differential lines, coplanar lines, etc. By way of specific example, the antenna region (12a) may include Yagi antenna devices as illustrated in FIGS. 7 and 8, which will be explained in detail below.

Furthermore, mounting the chip (12) with the antenna region (12a) disposed over the cavity (13) enables the antenna region (12a) to be surrounded by low loss material to minimize the effect on antenna performance. As noted above, the space/cavity (13) can be filled with air (dielectric constant=1) (FIG. 2) or filled with low loss encapsulation material (such as foam).

In other exemplary embodiments of the invention, wireless communication modules may be constructed using the IC chip (12) of FIGS. 1 and 2, where the chip (12) is mounted to a metallic surface without disposing the antenna region (12a) over a cavity, where the metallic surface acts as a reflector for the antenna. However, depending on the type/thickness of substrate material and BEOL dielectric material, such design could result in a lower bandwidth-efficiency product (e.g., narrowband operation and/or lower efficiency), which may be acceptable for certain applications.

Figure 3:
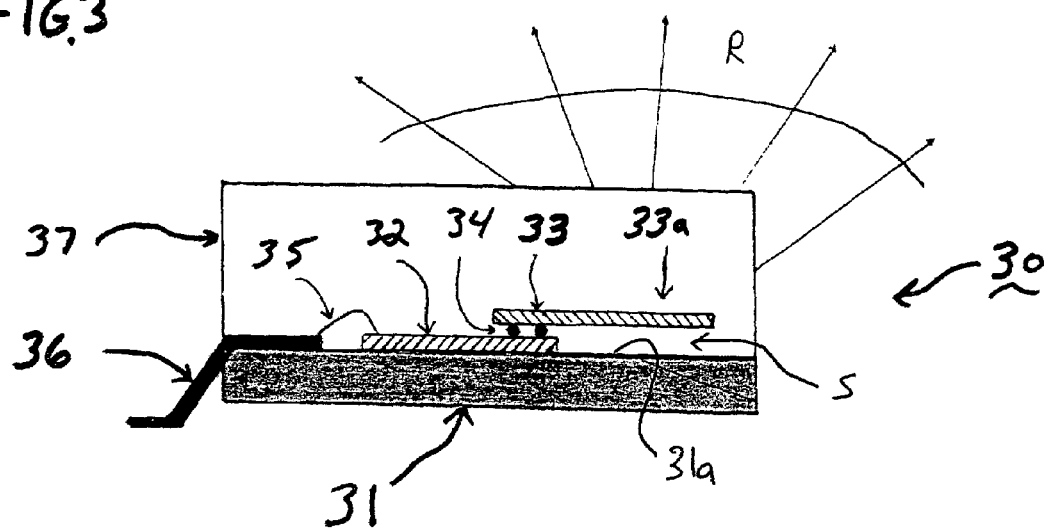
FIG. 3 is a schematic diagram illustrating an apparatus for integrally packaging an antenna and IC chip, according to another exemplary embodiment of the present invention.

In other exemplary embodiments of the invention, compact wireless communication modules can be constructed by packaging an IC chip with a planar antenna that is formed on a separate substrate that is mounted to the IC chip, as depicted in the exemplary diagrams of FIGS. 3~6, for example. By way of example, FIG. 3 is a schematic diagram of an apparatus (30) for integrally packaging an antenna and IC chip, according to an exemplary embodiment of the present invention. In general, the apparatus (30) comprises a metallic package base (31) which functions as a package frame structure. A semiconductor die (32) (or IC chip) is mounted on an upper surface of the package base (31). The IC chip (32) may comprise various types of integrated circuits, such as receivers, transmitters, transceivers, etc. The IC chip (32) may be formed of any suitable semiconductor material.

A semiconductor substrate (33) is mounted to the IC chip (32) via bonding ball connections (34) (e.g., C4s). The substrate (33) comprises an antenna region (33a) having one or more planar antennas. The substrate (33) is mounted to the IC chip (32) such that the antenna region (33a) extends past the surface edge of the IC chip (32) and is disposed at a distance away from the metallic surface (31a) of the base (31) forming a space S between the surface (31a) and bottom of the substrate (33). The metallic surface (31a) acts as a reflector for the antenna(s) to limit the antenna radiation to the upper hemisphere above the antenna.

The apparatus (30) further comprises wire bonds (35) that provide electrical connections (for I/O signals and power) between bond pads on the active surface of the IC chip (32) and appropriate package leads (36) The package structure is encapsulated by an encapsulation layer (37). The encapsulation layer (37) may be formed using any suitable material having a low dielectric loss and low dielectric constant. The encapsulation material (37) should have low dielectric loss to achieve efficient antenna radiation, but provide sufficient protection for the IC chip (32), bond wires (35) and antenna substrate (33).

Figure 4:
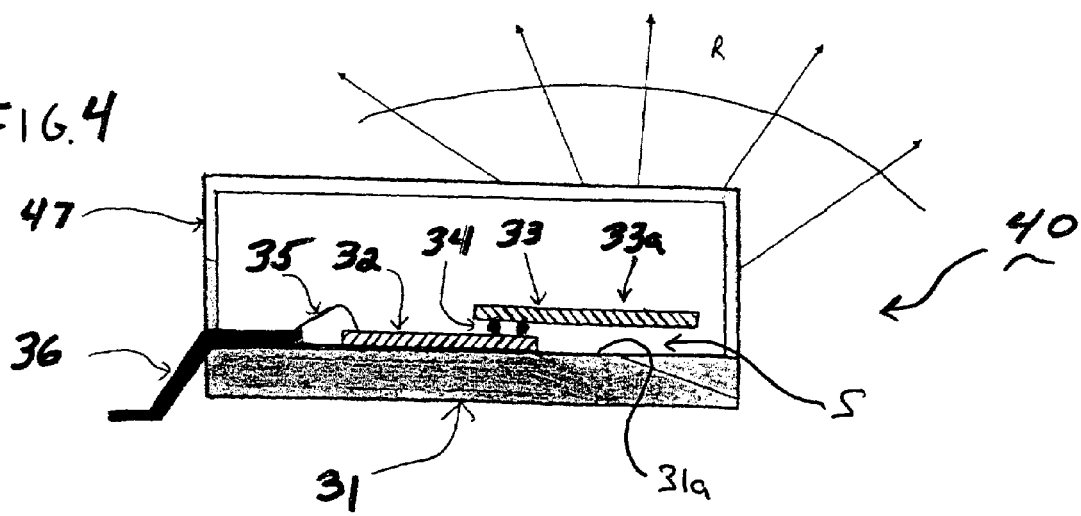
FIG. 4 is a schematic diagram illustrating an apparatus for integrally packaging an antenna and IC chip, according to another exemplary embodiment of the present invention.

FIG. 4 schematically depicts an electronic apparatus (40) for packaging an antenna and IC chip, according to an exemplary embodiment of the present invention. The electronic apparatus (40) of FIG. 4 has a structure that is similar to that of the electronic apparatus (30) of FIG. 3, except that the electronic apparatus (40) comprises a package lid (47) (or package cap). The package lid (47) is preferably formed of a low loss material such as polyimide, or other suitable materials. With such embodiment, the antenna region (33a) is surrounded by air or vacuum, as opposed to being embedded within encapsulation material as in the apparatus (30) of FIG. 3.

Figure 5:
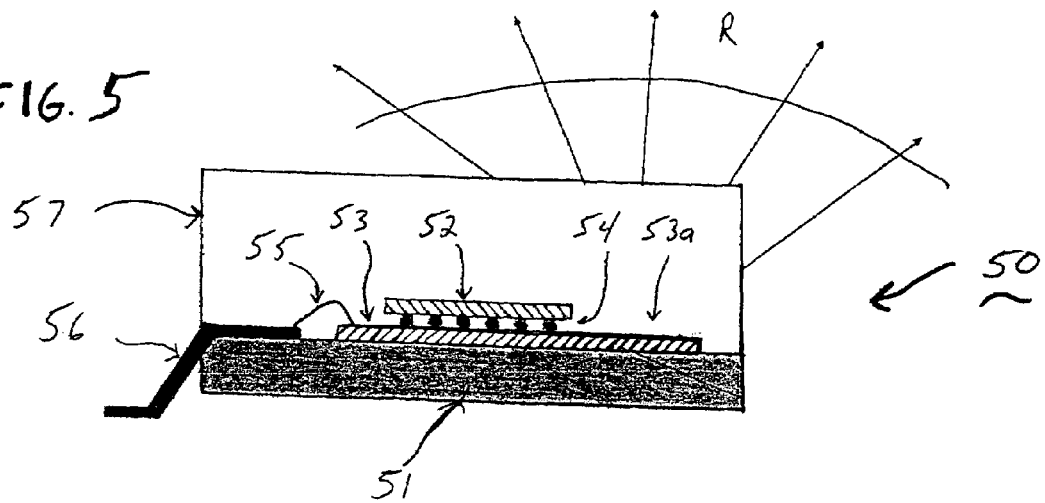
FIG. 5 is a schematic diagram illustrating an apparatus for integrally packaging an antenna and IC chip, according to another exemplary embodiment of the present invention.

FIG. 5 is a schematic side view of an electronic apparatus (50) for packaging an antenna and IC chip, according to an exemplary embodiment of the present invention. In general, the apparatus (50) comprises a planar metallic package base (51) which functions as a package frame structure. A semiconductor die (52) (or IC chip) is front-side (or flip-chip) mounted to a carrier substrate (53) via bonding ball connections (54) (e.g., C4s). The carrier substrate (53) is bonded to the metallic base (51). The carrier substrate (53) provides a space transformation for I/O electrical connections to/from the IC chip (52). The substrate (53) comprises an antenna region (53a) having one or more planar antenna devices formed thereon. The substrate (53) further comprises other metallization structures including through vias, transmission lines, antenna feeds, etc. The IC chip (52) is mounted to the carrier substrate (53) such that the antenna region (53a) is not overlapped by the IC chip (52). With this design, the package base (51) acts as a reflecting ground plane for the antenna such that antenna radiation R can radiate in some direction in an upper hemisphere without being blocked by the IC chip (52). The apparatus (50) further comprises wire bonds (55) that provide electrical connections (for I/O signals and power) between bond pads on the substrate (53) and appropriate package leads (56). The package structure is encapsulated by an encapsulation layer (57). The encapsulation layer (57) may be formed using any suitable material having a low dielectric loss and low dielectric constant. The encapsulation material (57) should have low dielectric loss to achieve efficient antenna radiation, but provide sufficient protection for the IC chip (52), bond wires (55) and antenna substrate (53).

Figure 6:
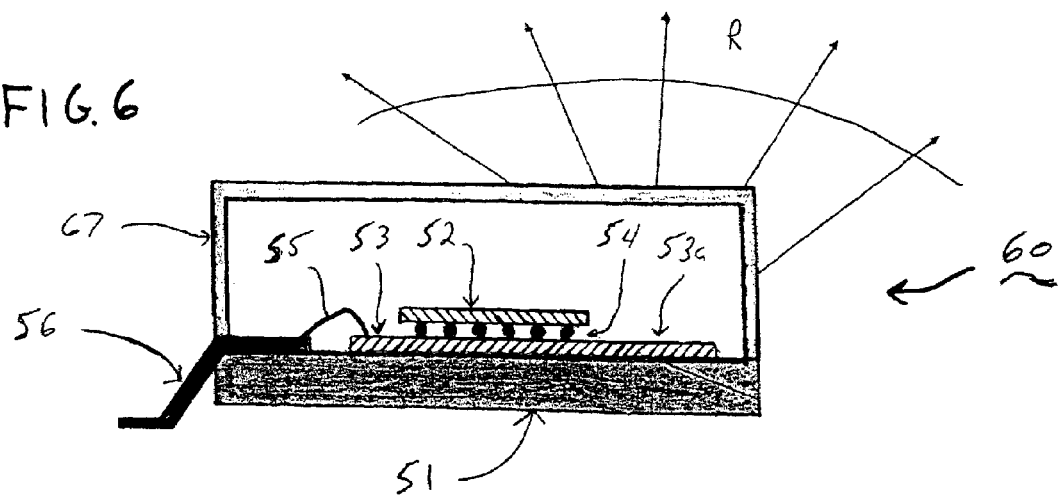
FIG. 6 is a schematic diagram illustrating an apparatus for integrally packaging an antenna and IC chip, according to another exemplary embodiment of the present invention.

FIG. 6 schematically depicts an electronic apparatus (60) for integrally packaging an antenna and IC chip according to another exemplary embodiment of the present invention. The electronic apparatus (60) of FIG. 6 has a structure that is similar to that of the electronic apparatus (50) of FIG. 5, except that the electronic apparatus (60) comprises a package lid (67) (or package cap). The package lid (67) is preferably formed of a low loss material such as polyimide, or other suitable materials. With such embodiment, the antenna region (53a) is surrounded by air or vacuum, as opposed to being embedded within encapsulation material as in the apparatus (50) of FIG. 5.

With the exemplary embodiments of FIGS. 3-6, the planar antennas are formed on separate antenna substrates (33, 53), which provides more design flexibility, but with lower level of integration (as compared to the on-chip antenna frameworks of FIGS. 1 and 2). For example, the use of a separate antenna substrate significantly minimizes or prevents EM coupling from the antenna to the active circuit devices. Moreover, the chip and antennas substrates can be selected independently such that different substrate materials with desired properties can be used to optimize system performance for a given application. For instance, depending on the application, the IC chips can be formed of semiconductor materials such as high resistivity silicon or GaAs, etc., while the antenna substrate may be formed of any suitable material including, for example, dielectric or insulative materials such as fused silica ($SiO_2$), alumina, polystyrene, ceramic, teflon based substrates, FR4, etc., or semiconductor materials such as silicon.

Moreover, the exemplary structures of FIGS. 3-6 can be formed using standard semiconductor fabrication and packaging techniques to enable low-cost, high yield mass production. For example, planar antennas, antenna feeds, transmission lines, vias, etc can be formed on the antenna substrate using standard methods known to those of ordinary skill in the art.

FIG. 7 schematically depicts an apparatus (70) for integrally packaging an antenna and IC chip according to another exemplary embodiment of the present invention. In particular, FIG. 7 is a top plan view of a wireless communication module (70) comprising an IC chip with an on-chip planar antenna integrally formed as part of the BOEL metallization process. The apparatus (70) comprises a mounting substrate (71) and IC chip (72). The IC chip (72) comprises an antenna region (72a) and active device region (72b), wherein the IC chip (72) is backside mounted to the substrate (71) such that the antenna region (72a) extends past a surface edge of the substrate (71). In one exemplary embodiment of the invention, the apparatus (70) has an architecture based on that depicted in FIGS. 1 or 2, for example, wherein the mounting substrate (71) is the mesa structure (11a) of the package base (11). In another exemplary embodiment of the invention, the substrate (71) may be a carrier substrate mounted to a package base, for example. The IC chip (72) comprises a plurality of bond pads (74) formed on the surface of the active device region (12b), which are connected to corresponding bond sites (75) on a carrier substrate or package leads, for example, using bond wires (73). The active device region (72b) may comprise various MMW functionalities as well as signal generation and up/down-conversion, for example, with the I/O signals taken off the die by the bond wires (73).

In the exemplary embodiment of FIG. 7, the antenna region (72a) comprises a planar Yagi antenna that is integrally formed as part of upper metallization of the BEOL structure of the IC chip (72). The planar Yagi antenna comprises a driven dipole antenna (76) which is fed by antenna feed (77), and a plurality of parasitic elements including reflector (78) and director (79) elements.

The antenna feed (77) may be a differential coplanar stripline, which is connected to active circuitry in the device region (72b) using a balun with crossed signal lines to obtain a single-ended feed. In another exemplary embodiment, the differential stripline can be connected directly to the differential input of a differential (e.g., push-pull) power amplifier circuit.

As with standard Yagi antennas, the director (79) is formed slightly shorter than the feed dipole (76). The parasitic elements (78) and (79) provide directionality to the antenna. More specifically, in the exemplary embodiment of FIG. 7, the planar Yagi antenna is directional in the horizontal plane (XY plane) along the positive x-axis perpendicular to the longitudinal axis (y-axis) of the dipole (76). In other words, due to the constellation of the feed (76) with the director (79) and reflector (78), most of the radiation energy is directed towards the edge of the antenna region (72a) away from the active device region (72b). With this exemplary design, the active device region (72b) is located behind the reflector (78) to minimize back coupling of EM energy from the antenna.

The die area for the antenna region (72a) is given by a×w while the die area for the active circuit region (72b) behind the reflector (78) is denoted by b×w. In one exemplary embodiment, the IC chip (72) is formed of semiconductor substrate material having a high dielectric constant and low loss tangent (e.g. high-resistivity silicon, GaAs or InP, etc.). When the IC chip (72) is formed of a substrate material having a high dielectric constant, the antenna size can be made below 0.1 free-space wavelength×0.5 free-space wavelength along the edge of the antenna region (72a) of the die (72) (e.g. <0.4 mm×2 mm @77 GHz). The small amount of die area required by the antenna enables the more die area to be allocated to the active device region (72b) sufficient for typical transceiver ICs. With such design, the exemplary antenna can achieve a wide (e.g. 5%) band width with high efficiency at the same time.

For purposes of determining electrical properties and characteristics of an on-chip antenna design according to the invention, computer simulations were performed for the exemplary antenna of FIG. 7 using the commercially available HFSS™ application from Ansoft. As is known in the art, HFSS™ is a 3D EM simulation software tool for RF, wireless, packaging, and optoelectronic design. For the simulation, a single element Yagi antenna similar to that depicted in FIG. 7 was modeled for a high-resistivity silicon (1 kOhm cm) substrate with a standard fused silica (SiO2)-based BEOL and having a 50 Ohm input impedance and a resonant frequency of about 78 Ghz. The antenna was simulated in free space without a package. The simulation results are depicted in FIGS. 10-12.

In particular, FIG. 10 graphically illustrates a simulated return loss of the model antenna and, in particular, the simulated return loss (S11) in dB for a frequency range of 70-85 GHz. The simulation results in FIG. 10 show a center frequency of 78 GHz and a wide bandwidth of around 4 GHz (76 Ghz-80 Ghz), wherein bandwidth is defined based on the frequency range for which $S_{11}$ was measured to be about −10 dB or better.

Moreover, FIGS. 11 and 12 illustrate the simulated horizontal and vertical radiation patterns, respectively, of the simulated antenna. The radiation patterns depicted in FIGS. 11 and 12 assume a Cartesian coordinate system as shown in FIG. 7, wherein the Z-axis extends in a direction perpendicular to the plane of the substrate (with positive Z direction above the substrate), wherein the x-axis extends along the plane of the substrate in a direction perpendicular to the longitudinal axis of the fed dipole (76) (with positive x in direction away edge of antenna region), and wherein the y-axis extends along the plane of the substrate in a direction parallel to the longitudinal axis of the fed dipole (76).

FIG. 11 depicts the horizontal radiation pattern (XY plane) in polar coordinates, wherein the energy is focused in the desired direction (i.e., positive x direction) at 0 degrees. FIG. 12 depicts the simulated vertical radiation patterns in polar coordinates for vertical planes defined by the ZY plane (phi=90 degrees) and the ZX plane (phi=0 degrees) wherein 0 degrees represents the positive z direction, 90 degrees represents the positive x direction and 180 degrees represents the negative z direction In FIG. 12, it is shown that there is minimal radiation in the ZY plane and in the ZX plane, the energy is focused in the desired direction (i.e., positive x direction).

FIG. 8 schematically depicts an electronic apparatus (80) for packaging an antenna and IC chip, according to an exemplary embodiment of the present invention. In particular, FIG. 8 is a top plan view of an electronic module having a package structure similar to that of FIG. 7 but including an on-chip linear antenna array that is formed using a plurality of Yagi antennas depicted in FIG. 7. In FIG. 8, the apparatus (80) comprises a mounting substrate (81) and an IC chip (82) having an antenna region (82a) and active device region (82b), and wherein the IC chip (82) is backside mounted to the substrate (81) such that the antenna region (82a) extends past a surface edge of the substrate (81). A plurality of bond pads (84) are formed on the surface of the active device region (82b), which are connected to corresponding bond sites (85) or leads using bond wires (83).

In the exemplary embodiment, the antenna region (82a) comprises a linear antenna array that is formed using a plurality of Yagi antennas such as depicted in FIG. 7. In particular, the antenna array comprises two dipole antennas (86a) and (86b), which are fed by respective antenna feeds (87a) and (87b), and a plurality of parasitic elements. The parasitic elements comprise an elongated reflector (88) (where separate reflectors for each Yagi antenna can be combined) and a plurality of directors (89a) and (89b), which provide directionality to the antennas. When the IC chip substrate is formed with a material (e.g., GaAs) having a relatively high dielectric constant, the length of the dipoles (87a) and (87b) can be less than one-half wave length in free space. In this regard, there is sufficient die area in the antenna region (82*a*) for the antenna elements to be placed one-half wave length apart along the edge of antenna region (82*a*) to thereby form a linear array of elements. Although two elements are depicted in FIG. 8, a linear antenna array can be formed with any number of elements, depending on the application and available die area.

In one exemplary embodiment of the invention, the on-chip linear antenna array of FIG. 8 can be implemented in various beamshaping applications which require certain antenna patterns. For instance, in the exemplary embodiment of FIG. 8, the antenna feed lines (87*a*) and (87*b*) can be connected to an on-chip feed network to hard code a desired antenna pattern. In another exemplary embodiment, each antenna can be connected to a separate transmitter or receiver in active area of the chip behind the reflector (88) to enable digital beam-forming, as is understood by those of ordinary skill in the art.

In another exemplary embodiment discussed below with reference to FIG. 9, an IC chip having an on-chip linear antenna array such as depicted in FIG. 8 can be mounted into a low cost aluminum package with an integrated cylindrical parabolic reflector to construct a low cost automotive radar module. In such embodiment, digital beam forming techniques can be employed to achieve a desired horizontal angular resolution, while a narrow vertical beam width (as required in certain radar applications) can be achieved by the parabolic reflector.

Figure 9:
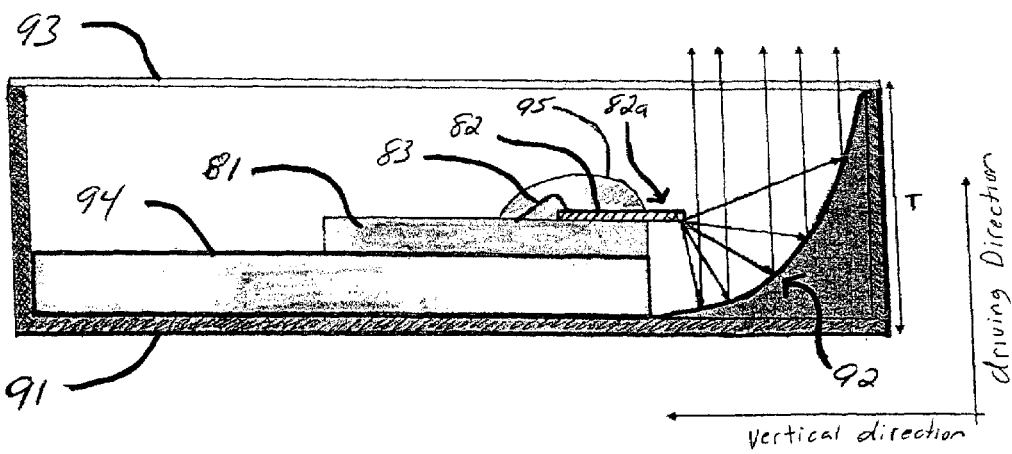
FIG. 9 is a schematic diagram illustrating an apparatus for integrally packaging an antenna and IC chip, according to another exemplary embodiment of the present invention.

By way of specific example, FIG. 9 schematically depicts an apparatus (90) for integrally packaging an IC chip to form a radar module, according to an exemplary embodiment of the present invention. In particular, FIG. 9 is a schematic side view of the electronic apparatus (90) which comprises the IC chip (82) and carrier substrate (81) depicted in FIG. 8. The apparatus (90) comprises a metallic package base (91) (which can be formed from aluminum). A cylindrical parabolic reflector (92) is disposed on one side of the package base (91). The reflector (92) can be integrally formed as part of the package base material, or separately formed and mounted in the package (90). The apparatus (90) comprises a package lid (93) (or package cap), which is formed of low loss material such as polyimide, or other suitable materials that are substantially transparent at the operating frequency of interest.

As discussed above with reference to FIG. 8, the IC chip (82) with the integrated Yagi antenna array is directly mounted onto the carrier (81) so that the antenna region (82*a*) extends past the edge of the carrier (81). The carrier (81) can be a PC board but in case the tolerances of the board technology do not allow this, the carrier (81) may be an intermediate board/carrier which is mounted to a second carrier/board (94). The I/O signals of the chip (82) are connected to the board/carrier (81) via bond wires (83). A glob top material (95) is formed over the device region of the chip (82) and the bond wires (83) to provide protection. Various control and power supply circuitry for the radar system can be mounted on the PC board (94). The exemplary package framework of FIG. 9 minimizes the package thickness T, which is a critical dimension for certain applications such as automotive radar products.

It is to be appreciated that the exemplary radar module of FIG. 9, provides a low cost, compact and flexible design that can be used in various military and commercial radar applications. The exemplary radar module can achieve a very narrow beam width of a few degrees in both the horizontal and vertical plane. In the horizontal plane, the Yagi antenna elements in the linear array can collectively provide a relatively broad beam, and digital beam forming techniques can be applied to achieve a desired angular resolution in the horizontal plane. Moreover, depending on the application, the reflector can be designed to provide the required directionality in the vertical direction. The exemplary radar module of FIG. 9 is particularly suitable for automatic radar applications requiring low cost compact radar devices. Such automotive radar devices can be used for various applications such as distance measurements (e.g., distance to objects in front or back of car), road side detection and/or side air bag firing or steering aids. Moreover, the flexible design can be used for to achieve higher angular resolution in the horizontal while covering a broader range in azimuth, which is contemplated for automotive radar applications.

It is to be understood that the exemplary electronic apparatus depicted in FIGS. 1-9 above can be constructed using various types of chip fabrication and packaging technologies, and that the invention is not limited to any specific chip fabrication and packaging technologies discussed herein.

Although exemplary embodiments have been described herein with reference to the accompanying drawings for purposes of illustration, it is to be understood that the present invention is not limited to those precise embodiments, and that various other changes and modifications may be affected herein by one skilled in the art without departing from the scope of the invention.

We claim:

1. An electronic apparatus, comprising:
   a metallic package frame;
   an IC (integrated circuit) chip comprising an active circuit region and an antenna region, wherein the antenna region comprises an antenna integrally formed as part of a BEOL (back-end-of-line) metallization structure of the IC chip; and
   a non-metallic package cover,
   wherein the metallic package frame comprises a mesa structure having a chip mounting surface, wherein the IC chip is mounted to the chip mounting surface such that the antenna region of the IC chip extends past an edge of the chip mounting surface.

2. The apparatus of claim 1, wherein the antenna region of the IC chip is disposed over a cavity region of the metallic package frame, wherein the cavity region comprises metallic bottom and sidewall surfaces.

3. The apparatus of claim 2, wherein the cavity is filled with a dielectric material.

4. The apparatus of claim 3, wherein the dielectric material is encapsulant material that forms the package cover.

5. The apparatus of claim 2, wherein the cavity is filled with air.

6. The apparatus of claim 2, wherein the cavity region comprises a parabolic reflector.

7. The apparatus of claim 1, wherein the metallic package frame comprises a leaded package frame.

8. The apparatus of claim 1, wherein the metallic package frame comprises a non-leaded package frame.

9. The apparatus of claim 1, wherein the antenna comprises a YAGI antenna comprising a reflector element, a fed dipole element and a director element.

10. The apparatus of claim 1, wherein the antenna region comprises a linear antenna array.

11. The apparatus of claim 1, wherein the IC chip comprises an integrally formed antenna feed network.

12. The apparatus of claim 1, wherein the IC chip comprises an integrated radio receiver circuit.

13. The apparatus of claim 1, wherein the IC chip comprise an integrated radio transmitter circuit.

14. The apparatus of claim 1, wherein the IC chip comprises an integrated radio transceiver circuit.

15. The apparatus of claim 1, wherein the antenna has a resonant frequency of about 30 GHz or greater.

16. The apparatus of claim 1, wherein the apparatus comprises a radar module.

17. The apparatus of claim 1, wherein the apparatus comprises a wireless communications module for data communication.

18. The apparatus of claim 1, wherein the apparatus comprises a wireless communications module for voice communication.

19. An electronic apparatus comprising:

a metallic package frame;

an IC (integrated circuit) chip comprising an active circuit region and an antenna region, wherein the antenna region comprises an antenna integrally formed as part of a BEOL (back-end-of-line) metallization structure of the IC chip; and a non-metallic package cover;

wherein the IC chip comprises a reflector element formed between the active circuit region and antenna region to reduce radiation coupling to the active circuit region.

* * * * *